(12) United States Patent
Srinivasan et al.

(10) Patent No.: US 10,502,784 B2
(45) Date of Patent: Dec. 10, 2019

(54) VOLTAGE LEVEL MONITORING OF AN INTEGRATED CIRCUIT FOR PRODUCTION TEST AND DEBUG

(71) Applicant: STMicroelectronics International N.V., Schiphol (NL)

(72) Inventors: Venkata Narayanan Srinivasan, Gautam Budh Nagar District (IN); Satinder Singh Malhi, Noida (IN)

(73) Assignee: STMicroelectronics International N.V., Schiphol (NL)

( * ) Notice: Subject to any disclaimer, the term of this patent is extended or adjusted under 35 U.S.C. 154(b) by 159 days.

(21) Appl. No.: 15/712,778

(22) Filed: Sep. 22, 2017

(65) Prior Publication Data

US 2019/0094301 A1 Mar. 28, 2019

(51) Int. Cl.
*G01R 31/3185* (2006.01)
*H01L 21/66* (2006.01)
*G01R 31/04* (2006.01)

(52) U.S. Cl.
CPC .... *G01R 31/318511* (2013.01); *G01R 31/041* (2013.01); *H01L 22/14* (2013.01); *H01L 22/34* (2013.01)

(58) Field of Classification Search
CPC . G01R 31/318511; G01R 31/41; H01L 22/14; H01L 22/34
See application file for complete search history.

(56) References Cited

U.S. PATENT DOCUMENTS

| | | | | |
|---|---|---|---|---|
| 4,520,321 | A * | 5/1985 | Nakatsugawa | G01R 25/00 327/12 |
| 5,757,203 | A * | 5/1998 | Brown | G01R 31/3008 324/750.3 |
| 9,698,771 | B1 * | 7/2017 | Srinivasan | H03K 5/19 |
| 2010/0162046 | A1 * | 6/2010 | Dervisoglu | G01R 31/31705 714/27 |
| 2012/0043991 | A1 * | 2/2012 | Lin | G01R 31/318575 326/16 |
| 2017/0089978 | A1 * | 3/2017 | Hao | G01R 31/318588 |
| 2018/0013418 | A1 * | 1/2018 | Srinivasan | H03K 5/19 |

* cited by examiner

*Primary Examiner* — Dominic E Hawkins
(74) *Attorney, Agent, or Firm* — Crowe & Dunlevy

(57) ABSTRACT

A scan chain collects scan chain data from testing of a functional circuit and outputs a scan chain signal containing the scan chain data. A voltage monitor circuit operates to compare a supply voltage against a threshold and assert a reset signal when the supply voltage crosses the threshold. The reset signal resets a flip flop circuit whose output signal controls operation of a logic circuit that blocks passage of the scan chain signal to an integrated circuit probe pad and instead applies a constant logic signal to the probe pad indicating a voltage monitoring error.

26 Claims, 3 Drawing Sheets

VOLTAGE LEVEL MONITORING OF AN INTEGRATED CIRCUIT FOR PRODUCTION TEST AND DEBUG

TECHNICAL FIELD

The present disclosure generally relates to the testing of integrated circuits and the determination of fault conditions.

BACKGROUND

Although semiconductor processing technology continues to advance, integrated circuits often include manufacturing errors. While the integrated circuits are still part of the production wafer, it is common to perform testing on the wafer to identify individual integrated circuits that do not perform properly. When the wafer is subsequently diced to produce individual integrated circuit die, each singulated die having an integrated circuit that failed to pass the testing can be segregated from the production. The singulated dice with integrated circuits that passed testing are forwarded on for further processing (such as, for example, packaging). The segregated dice having integrated circuits that failed testing may be discarded and may also be subjected to further testing to try to identify the precise circuitry that caused the testing failure.

To assist with the testing process on the wafer, it is common for each integrated circuit to include specifically designed test circuitry. Access to this test circuitry is made using automated test equipment (ATE) that probes the integrated circuit through probe pads that are electrically connected to the test circuitry. Voltages may be applied to certain probe pads, control signals may be applied to other probe pads and test output signals may be obtained from yet other probe pads.

One aspect of testing of particular importance evaluates operation of the integrated circuit at extreme operating conditions. For example, at extremes associated with temperature (high and low temperatures) and extremes of supply voltage (high and low voltage). The integrated circuits must pass testing at these extremes in order to proceed on for further processing.

FIG. 1 shows a simplified block diagram of a power management circuit 10 of an integrated circuit. The power management circuit 10 includes a plurality of functional voltage monitors (FVM) 16. These functional voltage monitors 16 are each associated with a certain power supply node 18. For example, the power supply node may be a relatively higher supply voltage (HV) node, a relatively lower supply voltage (LV) node or a (middle) supply voltage (MV) node for a voltage therebetween. The power supply nodes may be connected to a pad of the integrated circuit or may be connected to the output of a power supply circuit (such as a voltage regulator) contained within the integrated circuit. Each functional voltage monitor 16 operates to compare the voltage at the associated power supply node 18 to a voltage threshold. In the event that the monitored power supply voltage crosses (for example, falls below) the voltage threshold, the functional voltage monitor 16 asserts a reset signal 20. The reset signal 20 in the context of undervoltage monitoring is typically of the power on reset (POR) type which causes functional circuits 24 of the integrated circuit to reset their operation.

Although FIG. 1 illustrates a single HV functional voltage monitor 16, it will be understood that the power management circuit 10 may include a plurality of functional voltage monitors related to high voltage monitoring over a range of voltages (such as, for example, over a range from 2.7V to 6V with specific ones of the plurality of included HV voltage monitors being associated with different thresholds such as 2.7V, 3.0V, . . . , 6V). Likewise, the MV functional voltage monitor is representative of a plurality of functional voltage monitors related to medium voltage monitoring over a range of voltages (such as, for example, over a range from 1.5V to 2.16V with specific ones of the plurality of MV voltage monitors being associated with different thresholds such as 1.5V, . . . , 2.16V). Still further, the LV functional voltage monitor is representative of a plurality of functional voltage monitors related to low voltage monitoring over a range of voltages (such as, for example, over a range from 0.65V to 1.15V with specific ones of the plurality of LV voltage monitors being associated with different thresholds such as 0.65, . . . , 1.15V).

During integrated circuit testing, and in particular in association with the testing of the integrated circuit at extremes of supply voltage and temperature, the automated test equipment may apply certain voltages to the power supply nodes 18. As a result of the applied extreme operating condition test, the voltage at a given one of the power supply nodes 18 monitored by the functional voltage monitors 16 could fall below the test threshold and cause the reset (by POR) of the functional circuits 24. In some circumstances, this is undesirable because testing must then wait for the functional circuits to reset before moving on to a next test, thus delaying completion of test processing. To address the foregoing concern, it is known in the art to mask the reset signal 20 during testing. Masking circuitry 30, such as a logic gate circuit, responsive to a test mode signal 32 is accordingly provided between the output of the functional voltage monitors 16 and the functional circuits 24. When the test mode signal 32 is asserted, the masking circuitry 30 blocks the reset signal 20 from propagating to the functional circuits 24 and causing their reset.

SUMMARY

In an embodiment, a circuit comprises: a functional circuit; a scan chain coupled to the functional circuit and configured to collect scan chain data from testing of the functional circuit and output a scan chain signal containing the scan chain data; a voltage monitor circuit configured to compare a supply voltage to a threshold and assert a reset signal when the supply voltage crosses the threshold; a flip flop circuit configured to receive the reset signal and change a logic state of a flip flop output signal in response to assertion of the reset signal; and a logic circuit configured to block passage of the scan chain signal to an integrated circuit probe pad in response to the changed logic state of the flip flop output signal, wherein said integrated circuit probe pad is for probing by automated test equipment.

In an embodiment, a method comprises: generating a scan chain signal containing the scan chain data from testing of a functional circuit; comparing a supply voltage to a threshold and asserting a reset signal when the supply voltage crosses the threshold; and blocking passage of the scan chain signal to an integrated circuit probe pad in response to assertion of the reset signal, wherein said integrated circuit probe pad is for probing by automated test equipment.

In an embodiment, a circuit comprises: a functional circuit; a scan chain coupled to the functional circuit and configured to collect scan chain data from testing of the functional circuit and output a scan chain signal containing the scan chain data; a first voltage monitor circuit configured to compare a first supply voltage to a first threshold and assert a first reset signal when the first supply voltage crosses the first threshold; a first flip flop circuit configured to receive the first reset signal and change a logic state of a first flip flop output signal in response to assertion of the first reset signal; a second voltage monitor circuit configured to compare a second supply voltage to a second threshold and assert a second reset signal when the second supply voltage crosses the second threshold; a second flip flop circuit configured to receive the second reset signal and change a logic state of a second flip flop output signal in response to assertion of the second reset signal; a first logic gate configured to logically combine the first and second flip flop output signals to generate a control signal; a second logic gate having a first input configured to receive the scan chain signal and a second input configured to receive the control signal; a multiplexer circuit having a first input configured to receive the scan chain signal and a second input configured to receive a signal output from the second logic gate; and an integrated circuit probe pad connected to an output of the multiplexer circuit, wherein said integrated circuit probe pad is for probing by automated test equipment.

In an embodiment, a circuit comprises: a functional circuit; a scan chain coupled to the functional circuit and configured to collect scan chain data from testing of the functional circuit and output a scan chain signal containing the scan chain data; a first voltage monitor circuit configured to compare a first supply voltage to a first threshold and assert a first reset signal when the first supply voltage crosses the first threshold; a first flip flop circuit configured to receive the first reset signal and change a logic state of a first flip flop output signal in response to assertion of the first reset signal; a second voltage monitor circuit configured to compare a second supply voltage to a second threshold and assert a second reset signal when the second supply voltage crosses the second threshold; a second flip flop circuit configured to receive the second reset signal and change a logic state of a second flip flop output signal in response to assertion of the second reset signal; and a multiplexer having a first input coupled to receive the scan chain signal, a second input coupled to receive a first coded signal and third input coupled to receive a second coded signal, said multiplexer controlled by a multibit select signal, said multibit select signal being decoded to cause selection between the first, second and third inputs for connection to the output coupled to the probe pad.

In an embodiment, a method comprises: generating a scan chain signal containing the scan chain data from testing of a functional circuit; comparing a first supply voltage to a first threshold and asserting a first reset signal when the first supply voltage crosses the first threshold; comparing a second supply voltage to a second threshold and asserting a second reset signal when the second supply voltage crosses the second threshold; and decoding logic states of the first and second reset signals to selectively choose between the scan chain signal, a first coded signal identifying that the first supply voltage crossed the first threshold and a second coded signal identifying that the second supply voltage has crossed the second threshold for output at an integrated circuit probe pad, wherein said integrated circuit probe pad is for probing by automated test equipment.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which.

DETAILED DESCRIPTION

Figure 2:
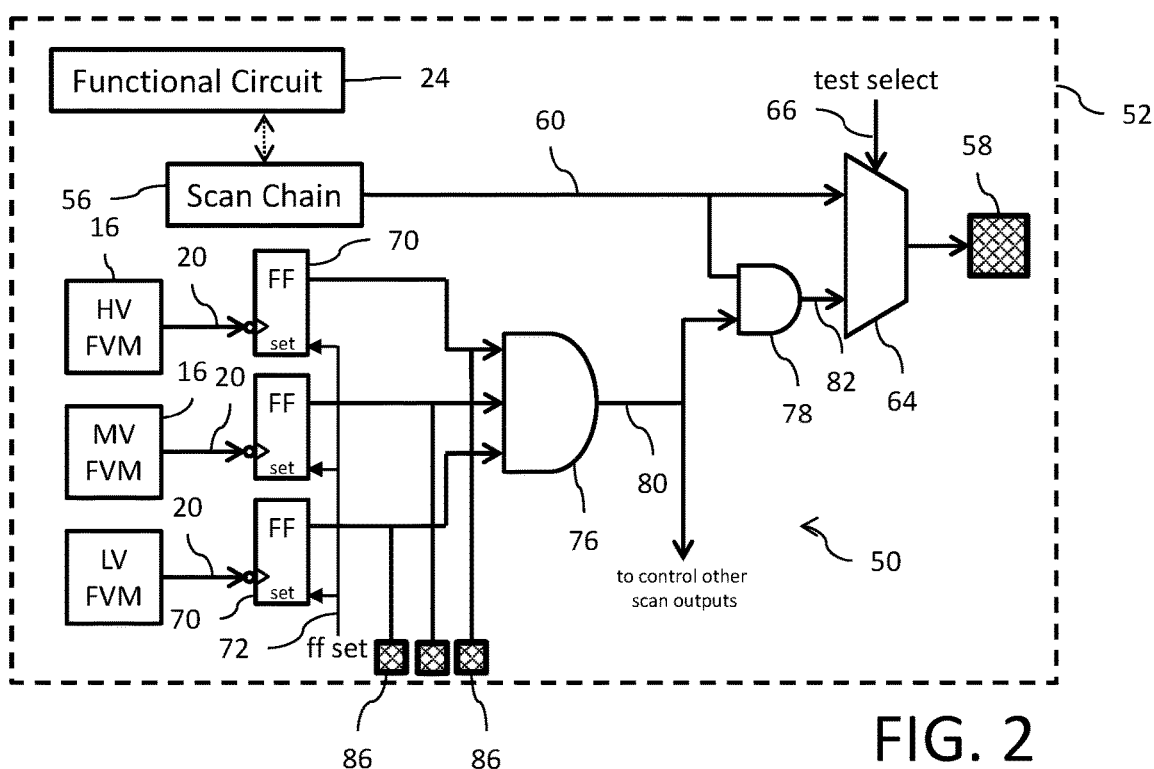
FIG. 2 shows a circuit diagram for a test circuit for an integrated circuit.

Reference is now made to FIG. 2 showing a circuit diagram for a test circuit 50 within an integrated circuit 52. The integrated circuit 52 includes functional circuits 24 (only one shown here for reasons of clarity). The test circuit 50 includes a scan chain 56 operable in a manner well known to those skilled in the art in association with the performance of an automated testing operation on the functional circuits 24 to collect from the functional circuit scan chain data in response to testing of the functional circuits, for example, as a result of the application of automated test pattern generator (ATPG) data. The scan chain 56 includes an output supplying a scan out signal 60 comprised of the scan chain data. The scan chain data of the scan out signal 60 may be compared by test equipment to a test pattern. Deviations between values of the scan chain data and the test pattern may indicate a failure of the functional circuits 24 or other circuits to pass a certain test.

The scan out signal 60 is accessible by the automated test equipment through a pad 58 of the integrated circuit that is configured or made available for probing using conventional wafer probing automated test equipment, such as through the use of a probe card. A multiplexer 64 has a first input coupled to receive the scan out signal 60 from the output of the scan chain 56. A select input of the multiplexer 64 receives a test select signal 66. When the test select signal 66 is in a first logic state (for example, logic 0), the multiplexer 64 is controlled to connect the first input receiving the scan out signal 60 to the output of the multiplexer 64, where that output is connected to the probe pad 58.

Figure 1:
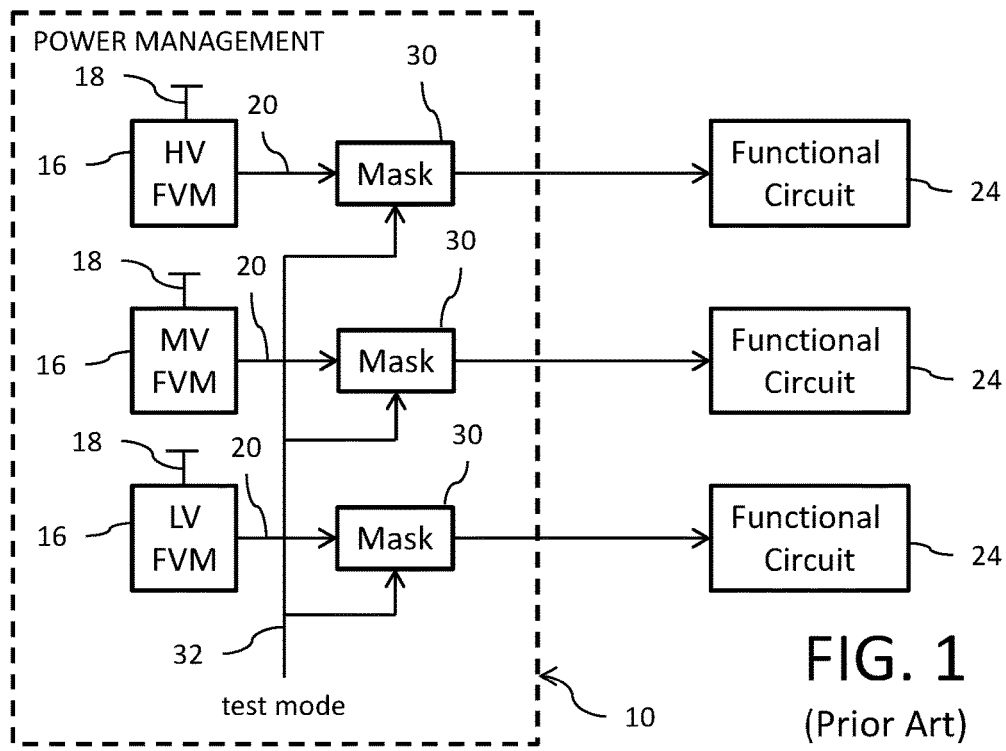
FIG. 1 shows a block diagram of a prior art power management circuit for an integrated circuit.

The plurality of functional voltage monitors (FVM) 16 operate in the manner described above with respect to FIG. 1 to individually assert their respective reset signals 20 when the monitored power supply voltage crosses (for example, falls below) the associated voltage threshold. Each reset signal 20 is applied to the clock input of a corresponding flip flop (FF) circuit 70 (of the negative edge triggered type). The set input of each flip flop circuit 70 receives a flip flop set signal 72. Responsive to the assertion of the flip flop set signal 72, the output of the flip flop circuit is set to logic 1. In an embodiment, the flip flop set signal 72 is asserted at the beginning of a test operation (i.e., during a test set-up phase of the test pattern when ATPG mode has not yet been entered). After completion of the test set-up phase and entry into ATPG mode, a test pattern (for example, in the context of automated test pattern generation (ATPG)) is applied to the input of the scan chain during scan in of the test mode of operation as known to those skilled in the art. Responsive to the assertion of the reset signal 20 at the clock input of a flip flop circuit 70, the output of that flip flop circuit 70 is set to logic 0.

The outputs of the flip flop circuits 70 are provided to the inputs of a logic AND gate 76. The control signal 80 output from the logic AND gate 76 as a result of the logical combination of the flip flop output signals is provided to the first input of a logic AND gate 78. A second input of the logic AND gate 78 receives the scan out signal 60 from the output of the scan chain 56. The signal 82 output from the logic AND gate 78 is applied to the second input of the multiplexer 64. When the test select signal 66 is in a second logic state (for example, logic 1), the multiplexer 64 is controlled to connect the multiplexer's second input (with signal 82 output from the logic AND gate 78) to the output of the multiplexer 64, so that the signal 82 is connected to the pad 58. The logic AND gate 78 functions in this configuration as a logic pass gate to selectively pass the signal at the second input in response to the logic state of the signal at the first input.

The outputs of the plurality of flip flop circuits 70 are further connected to corresponding debug pads 86. The debug pads 86 differ from the probe pad 58 in that the debug pads 86 are not configured or made available for probing using conventional wafer probing automated test equipment through a probe card. Rather, the debug pads 86 are accessible during debug operations (such as package test). In this regard, it is known in the art that during wafer test (i.e., electronic wafer sort (EWS), only a few pads of the integrated circuit are actually probed by the test equipment through the probe card. The debug pads 86 are pads which are not probed by the probe card. Pad 58 comprises one of many EWS pads of the integrated circuit while pads 86 are non-EWS pads. The pads 86 may, however, be accessed for package test after the integrated circuit has been singulated from the wafer. One difference between pad 58 and pads 86 is that pad 58 must be arranged on the integrated circuit in a manner which meets spacing rules for EWS associated with the configuration of the probes of the probe card. The pads 86, which are not subject to EWS probing, do not need to meet those EWS spacing rules.

Figure 3A:
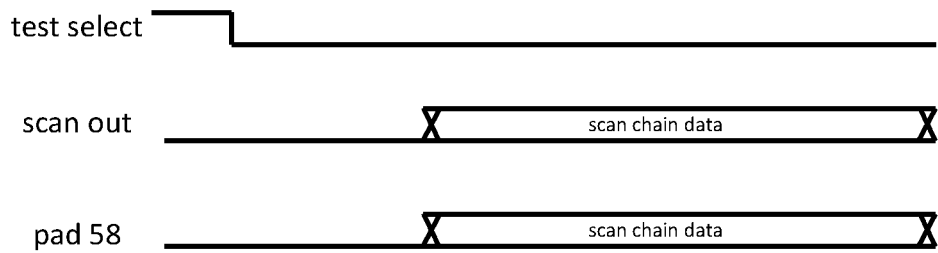
FIGS. 3A-3C show waveforms for various operational conditions of the test circuit.

Operation of the test circuit 50 is as follows:

In connection with a convention scan test, for example using ATPG, the test select signal 66 is set in the first logic state (logic 0) and the multiplexer 64 couples its first input to its output so as to pass the scan out signal 60 to the pad 58. The scan chain data of the scan out signal 60 are then received by the automated testing equipment by probing the probe pad 58, and the scan chain data may be compared during automated testing (EWS) to a test pattern for the purpose of detecting circuit malfunction. See, FIG. 3A where the test select signal 66 goes to logic 0 and the pad 58 receives the scan chain data of the scan out signal 60 through the first input of multiplexer 64.

In connection with a voltage level monitoring during ATPG, the test select signal 66 is instead set in the second logic state (logic 1) and the multiplexer 64 couples its second input to its output.

Figure 3B:
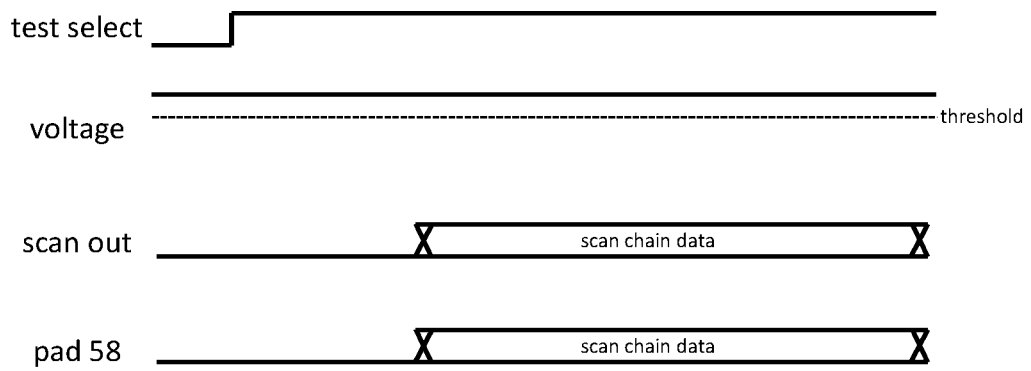

If the logic state of the signal 80 at the output of the logic AND gate 76 is logic 1 (indicating that none of the voltage monitoring circuits 16 have detected an aberrant voltage condition), the logic AND gate 78 will pass the scan out signal 60 (as signal 82) to the second input of the multiplexer 64. The multiplexer 64 couples its second input to its output in response to the test select signal 66 set in the second logic state (logic 1), and the scan out signal 60 is passed to the probe pad 58. The scan chain data of the scan out signal 60 are then received by the automated testing equipment by probing the probe pad 58 during EWS, and receipt of the scan chain data further indicates that no monitored voltage level has crossed (for example, fallen below) its corresponding threshold. See, FIG. 3B where the monitored power supply voltage at a given one of the voltage monitoring circuits has not crossed (for example, remains above) the voltage threshold (so reset signal 20 is not asserted) and logic AND gate 78 passes the scan chain data of the scan out signal 60 through the second input of multiplexer 64 to pad 58.

Figure 3C:
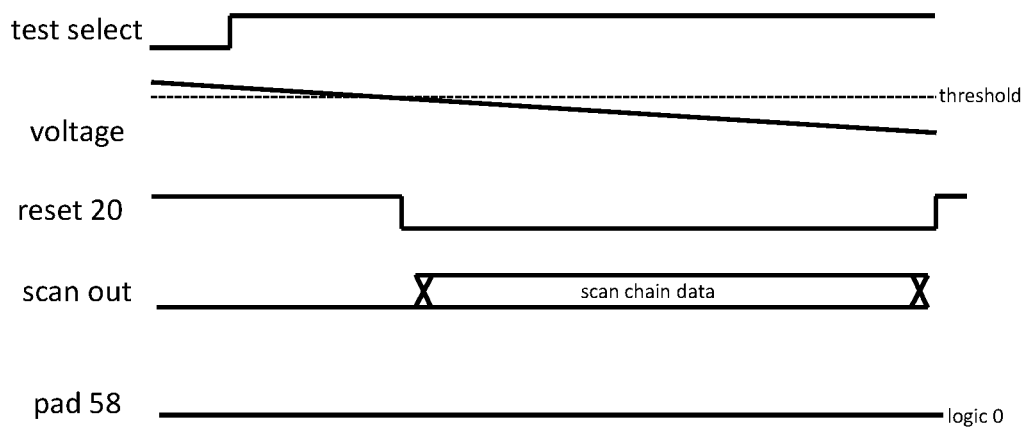

Conversely, if the logic state of the signal 80 at the output of the logic AND gate 76 is logic 0 (indicating that at least one of the voltage monitoring circuits 16 has detected an aberrant voltage condition), the logic AND gate 78 will block passage of the scan out signal 60 to the second input of the multiplexer 64. Instead, a logic 0 signal, corresponding to the logic state of the control signal 80, is applied as signal 82 to the second input of the multiplexer 64. The multiplexer 64 couples its second input to its output in response to the test select signal 66 set in the second logic state (logic 1), and the logic 0 signal is passed to the pad 58. The logic 0 signal is then received by the automated testing equipment by probing the probe pad 58 during EWS, and receipt of this signal in the logic 0 state indicates that at least one monitored voltage level has crossed (for example, fallen below) its corresponding threshold. See, FIG. 3C where the monitored power supply voltage at a given one of the voltage monitoring circuits has crossed (for example, fallen below) the voltage threshold (so reset signal 20 is asserted) and logic AND gate 78 blocks the scan chain data of the scan out signal 60 and a logic 0 signal is instead applied through the second input of multiplexer 64 to probe pad 58. At the end of the test, the flip flop set signal 72 may be asserted to set the flip flop 70 that detected the voltage problem back to the logic 1 state.

The logic 0 state of the control signal 80 at the output of the logic AND gate 76 occurs when any one of the flip flop circuits 70 has been reset by a reset signal 20 asserted by one of the functional voltage monitors 16. The reset signal 20 is asserted by the functional voltage monitor 16 when the monitored voltage crosses (for example, falls below) the threshold.

The specific examples discussed herein show functionality where the functional voltage monitor 16 is an undervoltage monitor that checks for the monitored voltage to fall below the threshold. It will, however, be understood that the concepts disclosed herein are equally applicable to functional voltage monitors 16 that operate as overvoltage monitors to detect a rise in supply voltage above a threshold.

Although FIG. 2 shows control being exercised over just a single scan output to a single probe pad 58, it will be understood that the control signal 80 may be applied to block all output of scan chain data in plural scan out signals to a corresponding plurality of probe pads 58.

Additionally, FIG. 2 shows the circuitry associated with a single scan chain 56 and scan out signal 60. It will be understood that multiple scan chains could be present and in such a case the AND gate 78 and multiplexer 64 circuitry illustrated in FIG. 2 could be replicated for each included scan chain 56. In such a case, a corresponding probe pad 58 for each scan chain 56 would be present at the output of the multiplexer. The control signal 80 would be applied to the second input of each included AND gate 78 as indicated by the arrow leading to control other scan outputs.

After wafer sort based on the testing operation, the segregated dice having integrated circuits that failed testing may be subjected to further testing to try and identify the reason for testing failure. To assist in this further testing, the debug pads 86 may be accessed during debug testing to determine which of the functional voltage monitors 16 asserted the reset signal 20 in response to the same testing conditions.

It will further be understood that the probe pads 58 are not only available for probe during EWS but are also bonded to package pins which are available for contact during final test (FT). In such a case, it will be noted that the pads 86 are also bonded out to package pins for access during FT.

Figure 4:
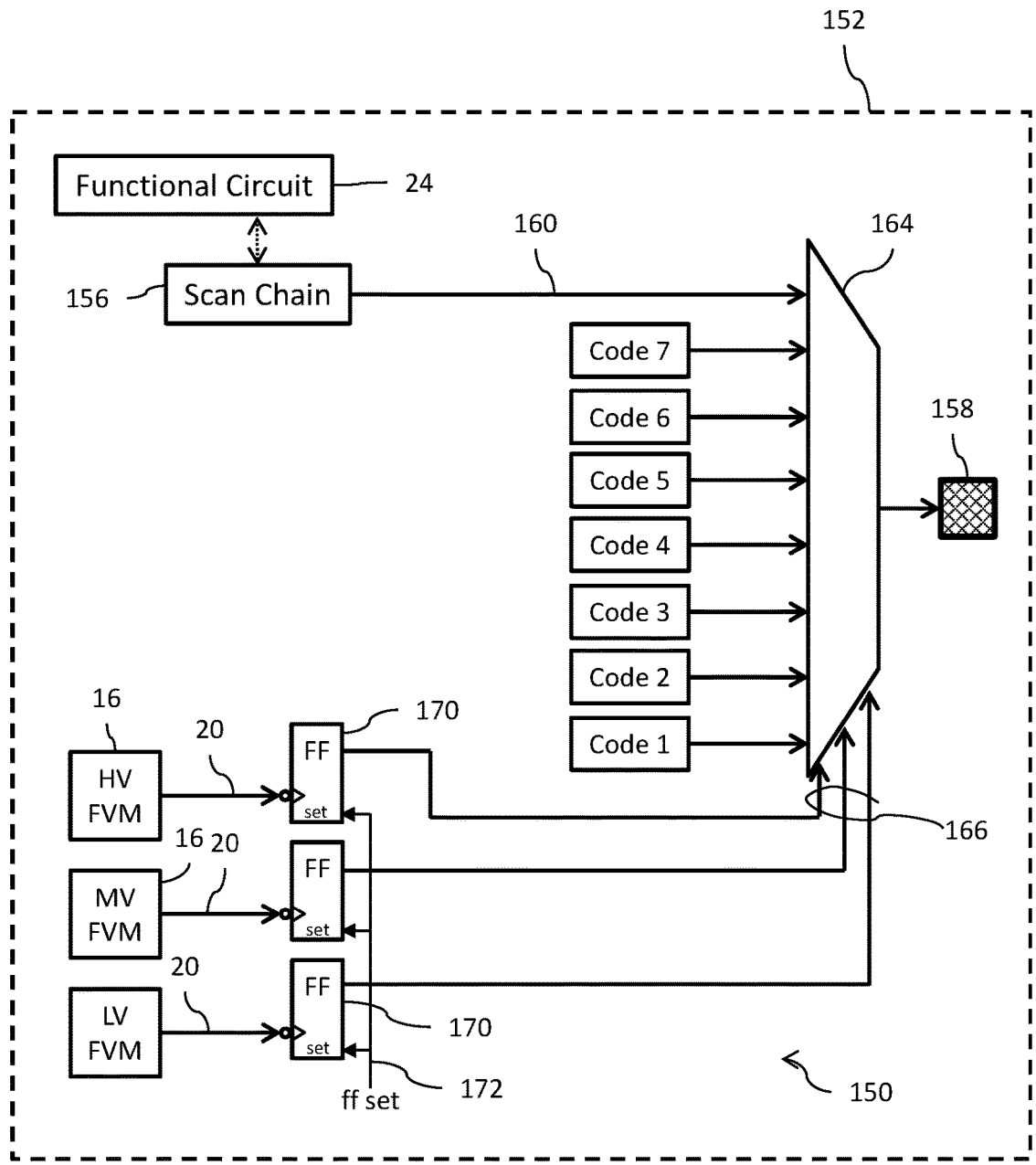
FIG. 4 shows a circuit diagram for a test circuit for an integrated circuit.

Reference is now made to FIG. 4 showing a circuit diagram for a test circuit 150 within an integrated circuit 152. The integrated circuit 152 includes functional circuits 24 (only one shown here for reasons of clarity). The test circuit 150 includes a scan chain 156 operable in a manner well known to those skilled in the art in association with the performance of an automated testing operation on the functional circuits 24 to collect from the functional circuit scan chain data in response to testing of the functional circuits, for example, as a result of the application of automated test pattern generator (ATPG) data. The scan chain 156 includes an output supplying a scan out signal 160 comprised of the scan chain data. The scan chain data of the scan out signal 160 may be compared by test equipment to a test pattern. Deviations between values of the scan chain data and the test pattern may indicate a failure of the functional circuits 24 or other circuits to pass a certain test.

The scan out signal 160 is accessible by the automated test equipment through a pad 158 of the integrated circuit that is configured and made available for probing using conventional wafer probing automated test equipment, such as through the use of a probe card during EWS. Also, the pad 158 will be bonded to a package pin and can be accessed by automated test equipment through a test board channel during FT. A multiplexer 164 has a first input coupled to receive the scan out signal 160 from the output of the scan chain 156. A select input of the multiplexer 164 receives a multibit select signal 166 that is decoded to make a selection of one of the inputs to the multiplexer for connection to the output of the multiplexer. When the multi-bit select signal 166 has a first data value (for example, <111>), the multiplexer 164 is controlled to connect the first input receiving the scan out signal 160 to the output of the multiplexer 164, where that output is connected to the probe pad 158.

The plurality of functional voltage monitors (FVM) 16 operate in the manner described above with respect to FIG. 1 to individually assert their respective reset signals 20 when the monitored power supply voltage crosses (for example, falls below) the associated voltage threshold. Each reset signal 20 is applied to the clock input of a corresponding flip flop (FF) circuit 170. The set input of each flip flop circuit 170 receives a flip flop set signal 172. Responsive to the assertion of the flip flop set signal 172, the output of the flip flop circuit is set to logic 1. In an embodiment, the flip flop set signal 172 is asserted at the beginning of a test operation (i.e., during a test set-up phase of the test pattern when ATPG mode has not yet been entered). After completion of the test set-up phase and entry into ATPG mode, a test pattern (for example, in the context of automated test pattern generation (ATPG)) is applied to the input of the scan chain during scan in of the test mode of operation as known to those skilled in the art. Responsive to the assertion of the reset signal 20 at the clock input of a flip flop circuit 170, the output of that flip flop circuit 170 is set to logic 0.

The signals output from the flip flop circuits 170 form the bits of the multi-bit select signal 166. Thus, in the case where each of the flip flop circuit 170 is set, and the signals output from the flip flop circuits 170 are all logic 1, the multi-bit select signal 166 has the first data value of <111> and the multiplexer 164 is controlled to connect the first input receiving the scan out signal 160 to the output of the multiplexer 164, where that output is connected to the probe pad 158. Any other bit combination for the multi-bit select signal 166 (from <000> to <110>), where any included logic 0 bit value is caused by a reset of the corresponding flip flop circuit 170 due to receipt of the reset signal 20, is decoded by the multiplexer 164 to select one of the other inputs of the multiplexer for connection to the output of the multiplexer. This selection will connect a fixed digital code (1-7; for example, 000 to 110) to the probe pad 158. The fixed code may correspond to the bit combination for the multi-bit select signal 166. So, a bit combination for the multi-bit select signal 166 of <000> will cause the multiplexer to select the fixed code 1 of 000. Similarly, a bit combination for the multi-bit select signal 166 of <010> will cause the multiplexer to select the fixed code 3 of 010.

Operation of the test circuit 150 is as follows:

In connection with a convention scan test, for example using ATPG, the multibit select signal 166 is forced to the first data value of <111> and the multiplexer 164 is controlled to connect the first input receiving the scan out signal 160 to the output of the multiplexer 164 so as to pass the scan out signal 160 to the pad 158. The scan chain data of the scan out signal 160 are then received by the automated testing equipment by probing the probe pad 158, and the scan chain data may be compared to a test pattern for the purpose of detecting circuit malfunction.

In connection with a voltage level monitoring during ATPG, the data values of the multibit select signal 166 depend on the logic state of the flip flop circuits 170. The logic 0 state of the output signal from a flip flop circuit 170 occurs when that flip flop circuit has been reset by a reset signal 20 asserted by a corresponding one of the functional voltage monitors 16. The reset signal 20 is asserted by the functional voltage monitor 16 when the monitored voltage crosses (for example, falls below) the threshold. This causes a change in data values of the multibit select signal 166, with the multibit select signal 166 being decoded to select the fixed digital code 1-7 for output to the probe pad 158. The output code signal is then received by the automated testing equipment by probing the probe pad 158, and the signal may be processed to provide a specific identification of which one or ones of the functional voltage monitors 16 have detected a supply voltage issue.

At the end of the test, the flip flop set signal 172 may be asserted to set the reset flip flop circuits 170 that detected a voltage problem back to the logic 1 state.

Although only a single probe pad 158 is shown, it will be understood that three separate pads 158 may be coupled to the output of the multiplexer 164 to individually present the bits of the selected fixed digital code.

Additionally, FIG. 4 shows the circuitry associated with a single scan chain 156 and scan out signal 160. It will be understood that multiple scan chains could be present and in such a case the multiplexer 164 would receive the corresponding scan out signals 160. For example, three scan chains could be present with, as discussed above, three separate pads 158 coupled to the output of the multiplexer 164 to individually present the three scan out signals in response to the multibit select signal 166 with a value of <111> and individually present the bits of the selected fixed digital code circuitry in response to the multibit select signal 166 having any other value.

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
   a functional circuit;
   a scan chain coupled to the functional circuit and configured to collect scan chain data from testing of the functional circuit and output a scan chain signal containing the scan chain data;
   a voltage monitor circuit configured to compare a supply voltage to a threshold and assert a reset signal when the supply voltage crosses the threshold;
   a flip flop circuit configured to receive the reset signal and change a logic state of a flip flop output signal in response to assertion of the reset signal; and
   a logic circuit configured to block passage of the scan chain signal to an integrated circuit probe pad in response to the changed logic state of the flip flop output signal, wherein said integrated circuit probe pad is for probing by automated test equipment.

2. The circuit of claim 1, wherein the flip flop circuit includes a clock input that receives the reset signal and a set input that receives a set signal.

3. The circuit of claim 2, wherein the set signal is asserted to set the flip flop circuit in a first logic state before a test operation begins, and the asserted reset signal causes the flip flop circuit to reset to a second logic state.

4. The circuit of claim 1, wherein the logic circuit comprises:
   a multiplexer circuit having a first input that receives the scan chain signal, a second input and an output coupled to the probe pad; and
   a logic pass gate having a first input that receives the scan chain signal, a second input that receives the flip flop output signal and an output coupled to the second input of the multiplexer.

5. The circuit of claim 4, wherein the multiplexer includes a control input configured to receive a select signal, wherein a logic state of the select signal chooses which of the first and second inputs of the multiplexer is connected to the output of the multiplexer.

6. The circuit of claim 4, the logic pass gate operating to pass the scan chain signal to the second input if the logic state of the flip flop output signal has not changed and further operating to apply a fixed logic level signal to the second input if the logic state of the flip flop output signal has changed.

7. The circuit of claim 4, wherein the logic pass gate is a logic AND gate.

8. The circuit of claim 1, wherein the logic circuit comprises:
   a multiplexer circuit having a first input that receives the scan chain signal, a second input that receives a first code signal and an output coupled to the probe pad, the multiplexer further receiving a select signal including a bit corresponding to the flip flop output signal, said select signal being decoded to cause selection between the first and second inputs for connection to the output coupled to the probe pad.

9. The circuit of claim 8, wherein the multiplexer includes a third input that receives an additional code signal, further comprising:
   an additional voltage monitor circuit configured to compare an additional supply voltage to an additional threshold and assert an additional reset signal when the additional supply voltage crosses the additional threshold;
   an additional flip flop circuit configured to receive the additional reset signal and change a logic state of an additional flip flop output signal in response to assertion of the additional reset signal;
   wherein said select signal further includes an additional bit corresponding to the additional flip flop output signal, said select signal being decoded to cause selection between the first, second and third inputs for connection to the output coupled to the probe pad.

10. The circuit of claim 1, further comprising a debug pad connected to the output of the flip flop circuit, wherein said debug pad is not for probing by automated test equipment during electronic wafer sort (EWS) but is available for connection to test equipment during package testing.

11. A method, comprising:
    generating a scan chain signal containing the scan chain data from testing of a functional circuit;
    comparing a supply voltage to a threshold and asserting a reset signal when the supply voltage crosses the threshold; and
    blocking passage of the scan chain signal to an integrated circuit probe pad in response to assertion of the reset signal, wherein said integrated circuit probe pad is for probing by automated test equipment.

12. The method of claim 11, further comprising:
    setting a flip flop circuit before beginning a test operation which generates the scan chain data; and
    resetting the flip flop circuit in response to assertion of the reset signal, wherein an output of the flip flop circuit when reset controls blocking passage of the scan chain signal to the integrated circuit probe pad.

13. The method of claim 11, further comprising:
    multiplexing the scan chain signal and selected passage of the scan chain signal in response to a select signal having a first logic state for multiplexed selection of the scan chain signal and a second logic state for multiplexed selection of the selected passage of the scan chain signal.

14. The method of claim 13, wherein selected passage of the scan chain signal is controlled in response to the assertion of the reset signal.

15. The method of claim 11, further comprising applying a fixed logic state signal to the integrated circuit probe pad if passage of the scan chain signal is blocked.

16. The method of claim 11, further comprising outputting a signal indicative of the reset signal to a debug pad, wherein said debug pad is not for probing by automated test equipment during electronic wafer sort (EWS) but is available for connection to test equipment during package testing.

17. A circuit, comprising:
    a functional circuit;
    a scan chain coupled to the functional circuit and configured to collect scan chain data from testing of the functional circuit and output a scan chain signal containing the scan chain data;
    a first voltage monitor circuit configured to compare a first supply voltage to a first threshold and assert a first reset signal when the first supply voltage crosses the first threshold;
    a first flip flop circuit configured to receive the first reset signal and change a logic state of a first flip flop output signal in response to assertion of the first reset signal;

a second voltage monitor circuit configured to compare a second supply voltage to a second threshold and assert a second reset signal when the second supply voltage crosses the second threshold;

a second flip flop circuit configured to receive the second reset signal and change a logic state of a second flip flop output signal in response to assertion of the second reset signal;

a first logic gate configured to logically combine the first and second flip flop output signals to generate a control signal;

a second logic gate having a first input configured to receive the scan chain signal and a second input configured to receive the control signal;

a multiplexer circuit having a first input configured to receive the scan chain signal and a second input configured to receive a signal output from the second logic gate; and an integrated circuit probe pad connected to an output of the multiplexer circuit, wherein said integrated circuit probe pad is for probing by automated test equipment.

18. The circuit of claim 17, wherein the multiplexer includes a control input configured to receive a select signal, wherein a logic state of the select signal chooses which of the first and second inputs of the multiplexer is connected to the output of the multiplexer.

19. The circuit of claim 17, the logic pass gate operating to pass the scan chain signal to the second input of the multiplexer if the control signal has a first logic state and further operating to apply control signal to the second input of the multiplexer if the control signal has a second logic state.

20. The circuit of claim 17, further comprising
a first debug pad for connection to test equipment during package test and connected to receive the signal output from the first flip flop circuit, and
a second debug pad for connection to test equipment during package test and connected to receive the signal output from the second flip flop circuit,
wherein neither of said first and second debug pads are for probing by automated test equipment during electronic wafer sort (EWS).

21. The circuit of claim 17, wherein each of the first and second flip flop circuits is set to a first logic state before a beginning of a test operation, and individually reset to a second logic state in response to assertion of a corresponding one of the first and second reset signals.

22. A circuit, comprising:
a functional circuit;
a scan chain coupled to the functional circuit and configured to collect scan chain data from testing of the functional circuit and output a scan chain signal containing the scan chain data;

a first voltage monitor circuit configured to compare a first supply voltage to a first threshold and assert a first reset signal when the first supply voltage crosses the first threshold;

a first flip flop circuit configured to receive the first reset signal and change a logic state of a first flip flop output signal in response to assertion of the first reset signal;

a second voltage monitor circuit configured to compare a second supply voltage to a second threshold and assert a second reset signal when the second supply voltage crosses the second threshold;

a second flip flop circuit configured to receive the second reset signal and change a logic state of a second flip flop output signal in response to assertion of the second reset signal; and a multiplexer having a first input coupled to receive the scan chain signal, a second input coupled to receive a first coded signal and third input coupled to receive a second coded signal, said multiplexer controlled by a multibit select signal, said multibit select signal being decoded to cause selection between the first, second and third inputs for connection to the output coupled to the probe pad.

23. The circuit of claim 22, wherein the first coded signal identifies the first voltage monitor circuit as having asserted the first reset signal and the second coded signal identifies the second voltage monitor circuit as having asserted the second reset signal.

24. The circuit of claim 23, the multiplexer further having a fourth input coupled to receive a third coded signal, wherein the third coded signal identifies both the first and second voltage monitor circuits as having asserted the first and second reset signals.

25. A method, comprising:
generating a scan chain signal containing the scan chain data from testing of a functional circuit;
comparing a first supply voltage to a first threshold and asserting a first reset signal when the first supply voltage crosses the first threshold;
comparing a second supply voltage to a second threshold and asserting a second reset signal when the second supply voltage crosses the second threshold; and
decoding logic states of the first and second reset signals to selectively choose between the scan chain signal, a first coded signal identifying that the first supply voltage crossed the first threshold and a second coded signal identifying that the second supply voltage has crossed the second threshold for output at an integrated circuit probe pad, wherein said integrated circuit probe pad is for probing by automated test equipment.

26. The method of claim 25, wherein decoding further selectively chooses a third coded signal identifying that both the first supply voltage crossed the first threshold and the second supply voltage has crossed the second threshold for output at the integrated circuit probe pad.

* * * * *